(12) United States Patent
Nguyen et al.

(10) Patent No.: US 12,200,854 B2
(45) Date of Patent: Jan. 14, 2025

(54) ELECTRONIC ASSEMBLY HAVING BOTH CHASSIS AND MODULE DUAL-FLOW CONNECTORS AND ASSOCIATED METHODS

(71) Applicant: EAGLE TECHNOLOGY, LLC, Melbourne, FL (US)

(72) Inventors: Voi Nguyen, Oviedo, FL (US); Charles Weirick, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 211 days.

(21) Appl. No.: 17/933,494

(22) Filed: Sep. 20, 2022

(65) Prior Publication Data
US 2024/0098874 A1   Mar. 21, 2024

(51) Int. Cl.
| | |
|---|---|
| *F16L 37/34* | (2006.01) |
| *F16L 37/35* | (2006.01) |
| *H05K 1/02* | (2006.01) |
| *H05K 7/20* | (2006.01) |

(52) U.S. Cl.
CPC ........... *H05K 1/0203* (2013.01); *F16L 37/34* (2013.01); *F16L 37/35* (2013.01); *H05K 1/0272* (2013.01); *H05K 7/20272* (2013.01)

(58) Field of Classification Search
CPC .............. H05K 1/0203; H05K 1/0272; H05K 7/20272; F16L 37/34; F16L 37/35
USPC ....................................................... 174/252
See application file for complete search history.

(56) References Cited

U.S. PATENT DOCUMENTS

| | | | |
|---|---|---|---|
| 345,516 A * | 12/1969 | Keller | |
| 4,732,414 A * | 3/1988 | Inaba | F16L 39/005 285/353 |
| 7,717,470 B1 * | 5/2010 | Pluymers | F16L 55/07 285/13 |
| 10,473,252 B2 * | 11/2019 | Oberdorfer | F16L 53/32 |
| 11,363,738 B2 | 6/2022 | Thompson et al. | |
| 11,792,959 B2 * | 10/2023 | Gao | H05K 7/208 62/259.2 |
| 2003/0034648 A1 * | 2/2003 | Zitkowic, Jr. | F16L 37/144 285/305 |
| 2007/0241560 A1 * | 10/2007 | Malone | F16L 9/19 285/123.3 |
| 2013/0049355 A1 * | 2/2013 | Weinhold | F16L 39/005 29/525.14 |
| 2023/0086534 A1 * | 3/2023 | Gao | H05K 7/208 62/259.2 |
| 2023/0089354 A1 * | 3/2023 | Gao | F28F 9/0256 361/679.53 |

* cited by examiner

*Primary Examiner* — Timothy J Thompson
*Assistant Examiner* — Michael F McAllister
(74) *Attorney, Agent, or Firm* — ALLEN, DYER, DOPPELT, + GILCHRIST, P.A. Attorneys at Law

(57) ABSTRACT

An electronic assembly may include a chassis having electronic module mounting positions. Each mounting position may have associated therewith a chassis liquid dual-flow connector. A respective electronic module may be received in each electronic module mounting position and include a circuit board, a liquid cooling path associated with the circuit board, and a module liquid dual-flow connector coupled to the liquid cooling path and configured to be mateable with the chassis liquid dual-flow connector.

21 Claims, 6 Drawing Sheets

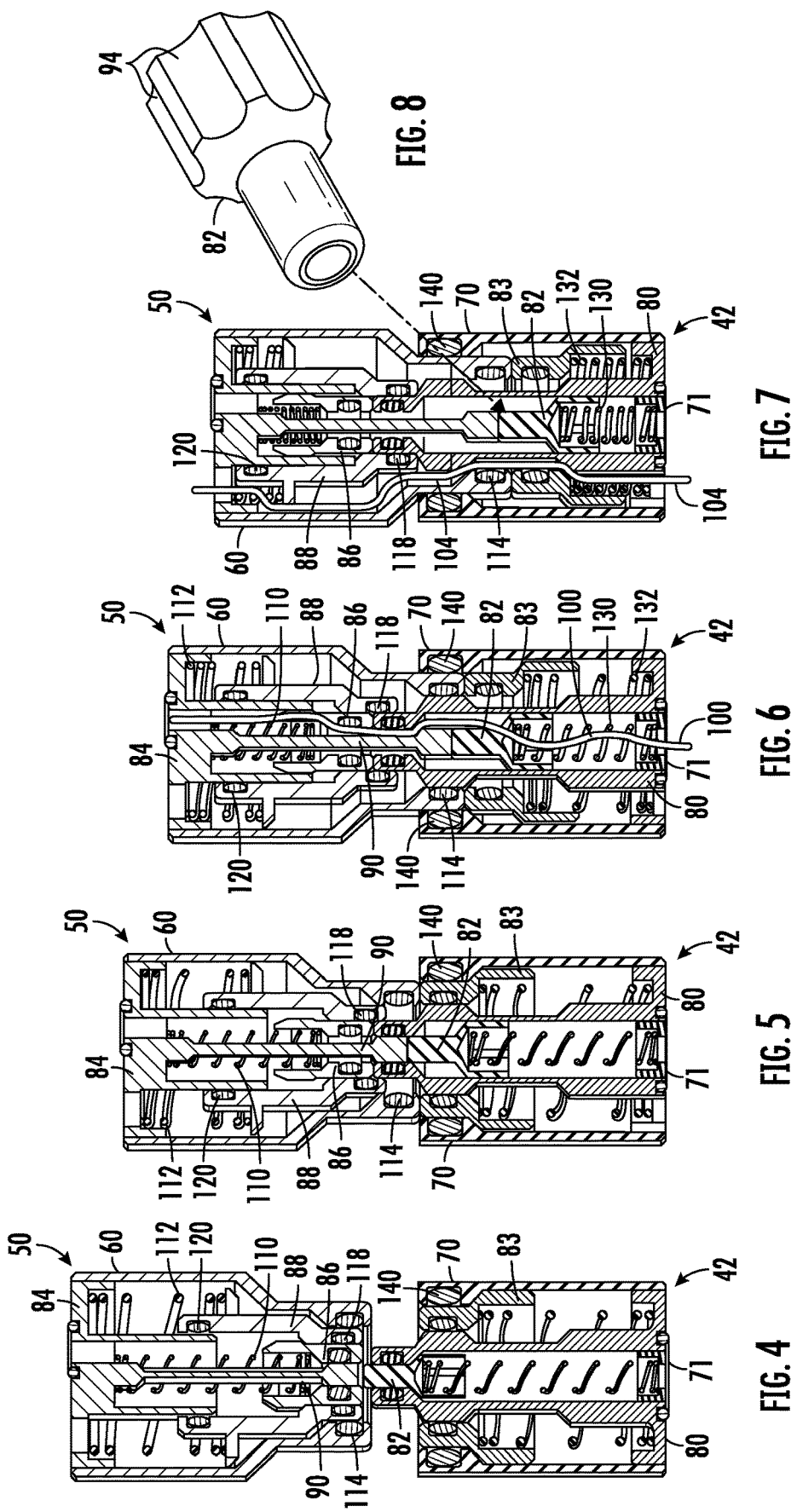

ELECTRONIC ASSEMBLY HAVING BOTH CHASSIS AND MODULE DUAL-FLOW CONNECTORS AND ASSOCIATED METHODS

FIELD OF THE INVENTION

The present invention relates to the field of electronic assemblies, and, more particularly, relates to electronic assemblies having a chassis and electronic modules with liquid cooling paths and related methods.

BACKGROUND OF THE INVENTION

As electronic packaging density and dissipated power requirements increase to achieve higher levels of electronic performance, the need for efficient thermal transport within electronic assemblies having electronic modules carrying printed circuit boards also increases. Even though electronic components are becoming smaller with greater processing capability, and operate at a much lower power, these two advantages may have the effect of increasing thermal density because circuit designers are expected to pack even more functionality into ever smaller circuit spaces, thus increasing heat generation and requiring more advanced cooling and thermal management.

Brute force heat transfer techniques involve forced air, active liquid cooling, and similar heat transport mechanisms to transport heat from sensitive electronic components to heat sinks or similar heat spreading devices. Some heat transfer systems even use composite structures, for example, annealed pyrolytic graphite (APG) embedded within metallic skins or heat pipes connected to spreader plates.

A new industry standard, however, encourages the increased use of liquid flow through (LFT) cooling to reduce dependence on conduction cooling using 3U and 6U plug-in modules and circuit cards having backplanes and configured for use in 3 rack or 6 rack units. The ANSI/VITA 48.2 mechanical form-factor standard leverages liquid flow through cooling for chassis architectures to provide increased thermal performance while mitigating risk to electronic modules carrying different electronic components. The liquid, normally ethylene glycol/water or propylene glycol/water, is isolated to cooling paths adjacent the circuit board and the electronic components, where there are no foreign object debris (FOD), contaminants or impingements to the airflow.

The VITA 48.2 AFT standard is directed to channeling the liquid through plug-in electronic modules and heat sinks that interface with a liquid manifold to reduce thermal resistances between the cooling liquid and the heat-generating electronic components and provide a common framework for original equipment manufacturer (OEM) chassis and electronic module manufacturers. State-of-the-art designs that implement the VITA 48.2 AFT technology, however, may have technical drawbacks because of the complexity due to liquid coming in through the backplane. Additionally, the mating of various components in current designs takes up valuable input/output design space for modules, increases fluid manifold complexity, and complicates final assembly of electronic components and plug-in modules.

SUMMARY OF THE INVENTION

In general, an electronic assembly may comprise a chassis having a plurality of electronic module mounting positions. Each mounting position may have associated therewith a chassis liquid dual-flow connector. A respective electronic module may be received in each electronic module mounting position and may comprise a circuit board, a liquid cooling path associated with the circuit board, and a module liquid dual-flow connector coupled to the liquid cooling path and configured to be mateable with the chassis liquid dual-flow connector.

The chassis liquid dual-flow connector and module liquid dual-flow connector may define a quick disconnect connector arrangement. The chassis liquid dual-flow connector and the module liquid dual-flow connector may establish an inner liquid flow path and an outer liquid flow path surrounding the inner liquid flow path when in a fully mated position. The chassis liquid dual-flow connector and module liquid dual-flow connector may establish the inner liquid flow path before the outer liquid flow path when in a partially mated position.

In an example, the chassis liquid dual-flow connector may comprise a chassis connector body and first and second chassis liquid valves carried thereby. The first and second chassis liquid valves may be in a closed position when the chassis liquid dual-flow connector is an unmated position, and may be in an open position when the chassis liquid dual-flow connector is in a fully mated position. The module liquid dual-flow connector may comprise a module connector body and first and second module liquid valves carried thereby. The first and second module liquid valves may be in a closed position when the module liquid dual-flow connector is an unmated position, and may be in an open position when the module liquid dual-flow connector is in a fully mated position.

The chassis may comprise a backplane electrical connector. The electronic module may comprise an electrical connector carried by the circuit board along a back edge thereof and mateable with the backplane electrical connector. The module liquid dual-flow connector may be on the back edge of the circuit board adjacent the electrical connector.

Another aspect is directed to a method of mounting an electronic module in a respective mounting position of a chassis. The mounting position may have associated therewith a chassis liquid dual-flow connector. The electronic module may comprise a circuit board, a liquid cooling path associated with the circuit board, and a module liquid dual-flow connector coupled to the liquid cooling path. The method may comprise slidably mounting the electronic module in respective mounting position of the chassis so that module liquid dual-flow connector removably mates with the chassis liquid dual-flow connector.

BRIEF DESCRIPTION OF THE DRAWINGS

Other objects, features and advantages of the present invention will become apparent from the Detailed Description of the invention which follows, when considered in light of the accompanying drawings in which:

FIG. 4 is a sectional view of the module liquid dual-flow connector and chassis liquid dual-flow connector before mating.

FIG. 5 is a sectional view of the module liquid dual-flow connector and chassis liquid dual-flow connector when initially engaged.

FIG. 6 is a sectional view of the module liquid dual-flow connector and the chassis liquid dual-flow connector when in a partially mated position and the inner liquid flow path established.

FIG. 7 is a sectional view of the module liquid dual-flow connector and the chassis liquid dual-flow connector when fully mated and the inner liquid flow path and outer liquid flow path are established.

FIG. 8 is an isometric view of the chassis valve plug used in the chassis liquid dual-flow connector.

DETAILED DESCRIPTION

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

Figure 1:
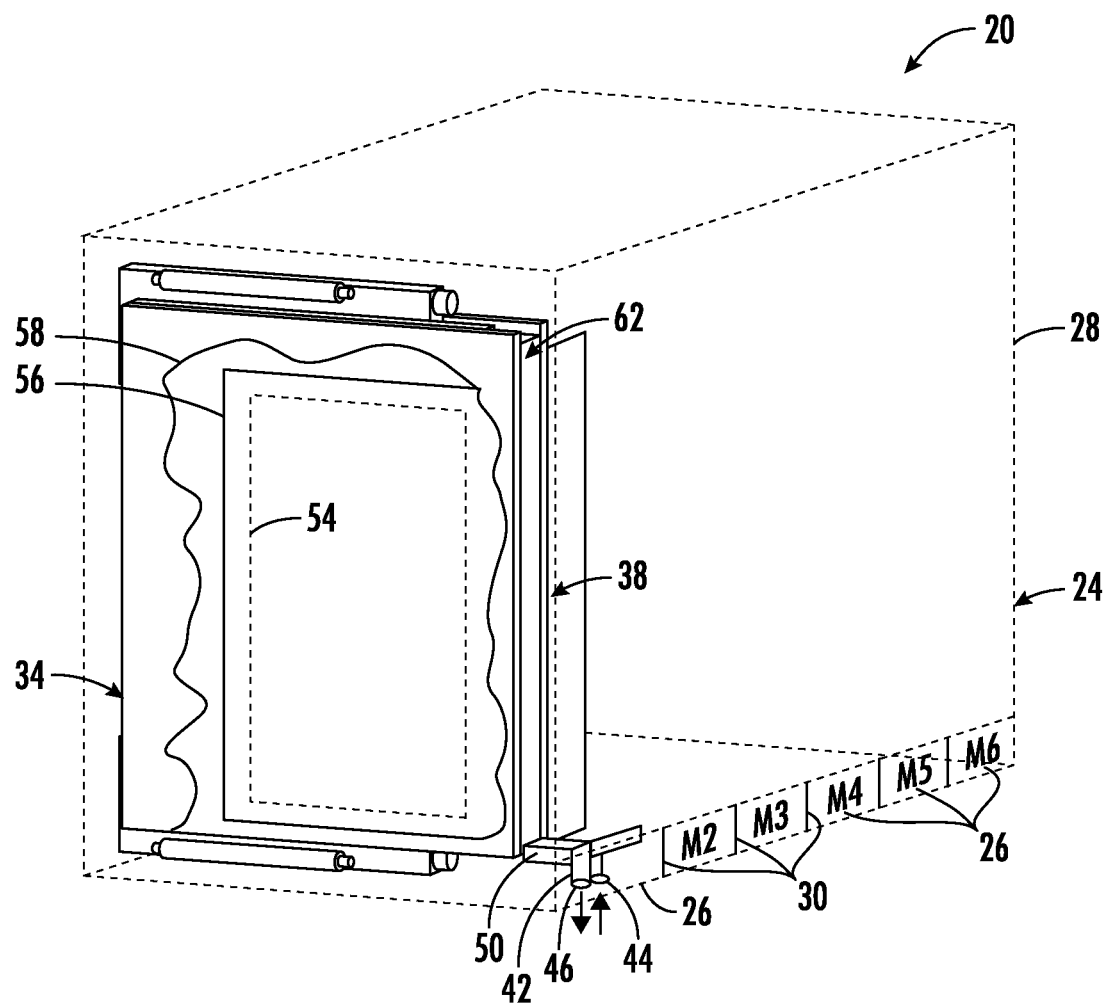
FIG. 1 is an isometric view of the electronic assembly showing an electronic module and a module liquid dual-flow connector mated to a chassis liquid dual-flow connector.

Referring initially to FIG. 1, an electronic assembly is shown generally at 20 and includes a chassis 24 having a plurality of electronic module mounting positions 26. The electronic assembly 20 illustrated in FIG. 1 does not show its complete sidewalls and other structural members for the chassis 24 in detail. Portions of the sidewalls and other structural members of the chassis 24 are outlined by the dashed lines at 28 for purposes of illustrating the configuration of the electronic assembly 20. The chassis 24 may include a plurality of electronic module mounting rails 30 at each electronic module mounting position 26 that may slidably receive a respective electronic module illustrated generally at 34. For purposes of illustration in FIG. 1, only one electronic module 34 is shown received in the first electronic mounting position 26, leaving five remaining electronic module mounting positions shown by the legend M2, M3, M4, M5 and M6, which each may mount an electronic module. In this example, the chassis 24 includes a backplane electrical connector shown schematically at 38.

Figure 3:
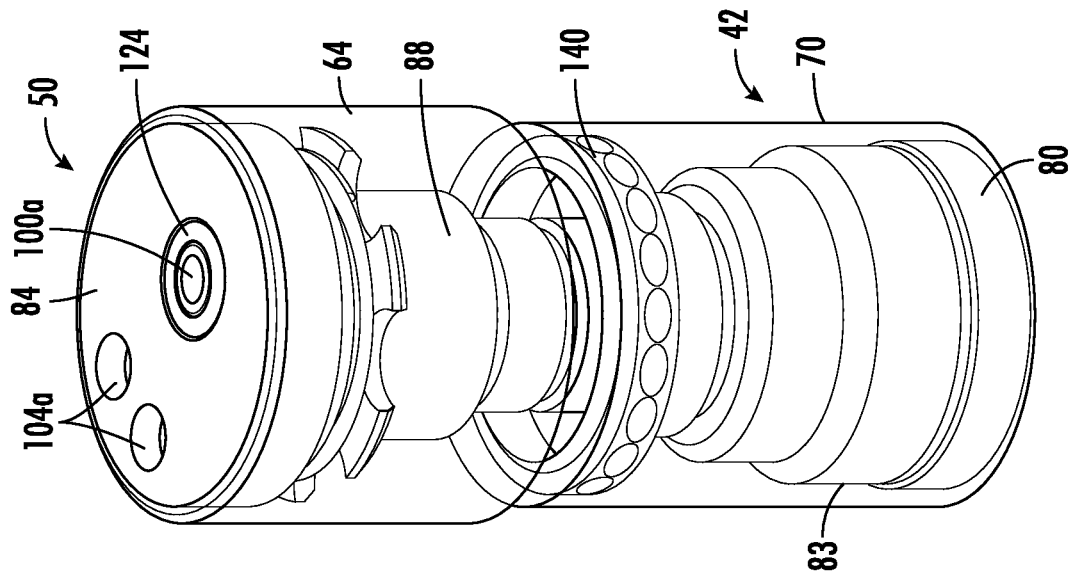
FIG. 3 is an isometric view of the module liquid dual-flow connector mated with the chassis liquid dual-flow connector looking in the direction of the module liquid dual-flow connector.
Figure 2:
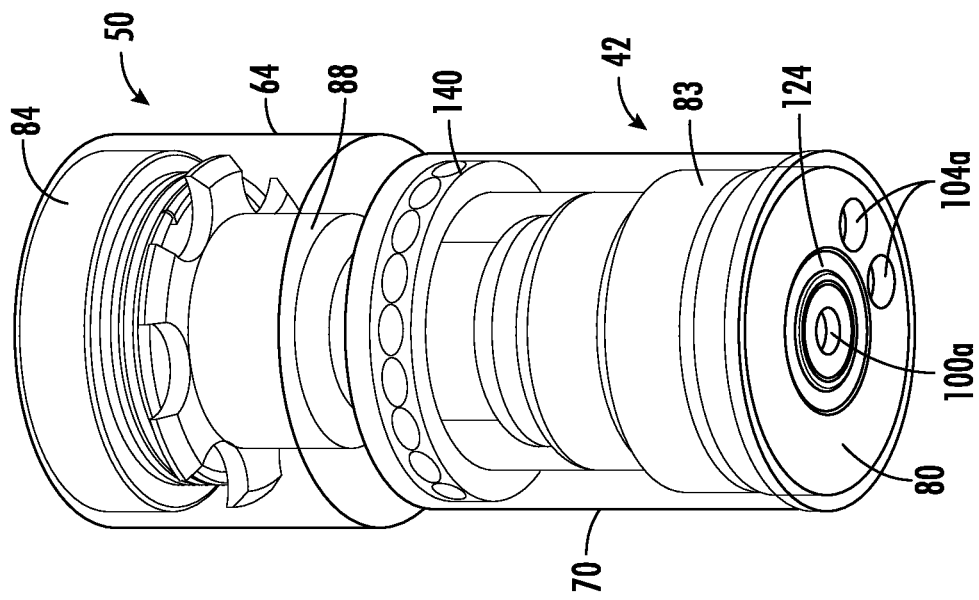
FIG. 2 is an isometric view of the module liquid dual-flow connector mated with the chassis liquid dual-flow connector looking in the direction of the chassis liquid dual-flow connector.

Each electronic module mounting position 26 has associated therewith a chassis liquid dual-flow connector 42 with only one chassis liquid dual-flow connector illustrated schematically adjacent the inserted electronic module 34. Each chassis liquid dual-flow connector 42 connects to a liquid supply line 44 and a liquid discharge line 46 that extend transverse across the chassis 24 and supply cooling liquid to an electronic module 34 and discharge cooling liquid from the electronic module via the chassis liquid dual-flow connector when fully mated with a module liquid dual-flow connector shown generally at 50 (FIGS. 2 and 3). The module liquid dual-flow connector 50 is coupled to a liquid cooling path 54 shown schematically in the partial breakaway section 58 in FIG. 1 and associated with a circuit board 56 in the electronic module 34. An electrical connector 62 is carried by the circuit board 56 along a back edge thereof as shown in FIG. 1 and mateable with the backplane electrical connector 38. The module liquid dual-flow connector 50 is positioned on the electronic module 34 at the back edge of the circuit board 56 adjacent the electrical connector 62.

Figure 10:
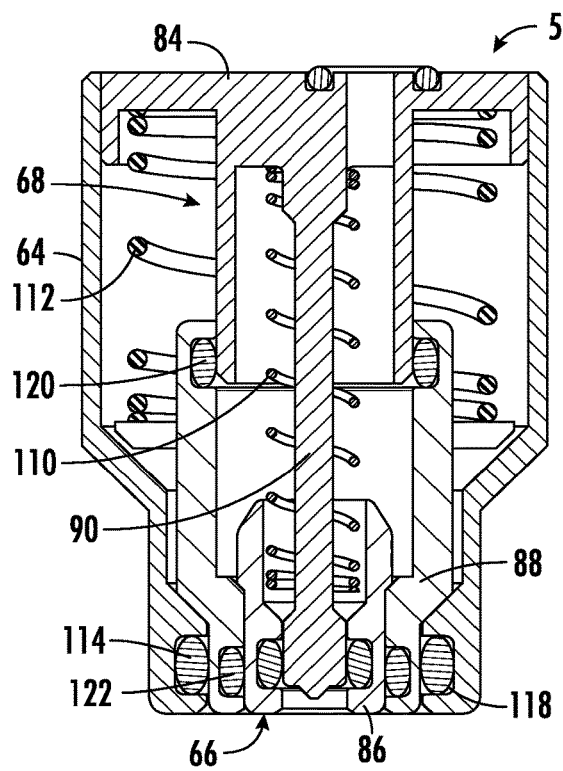
FIG. 10 is a sectional view of the module liquid dual-flow connector in a closed position before mating with the chassis liquid dual-flow connector.
Figure 11:
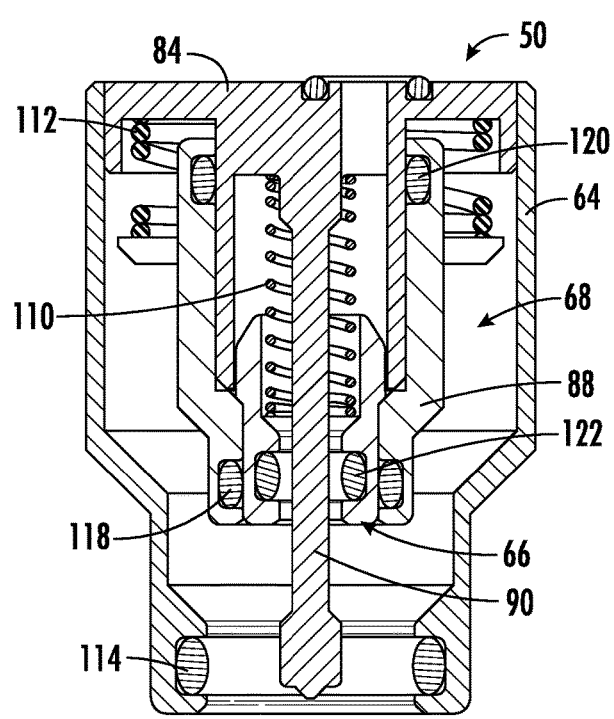
FIG. 11 is a sectional view of the module liquid dual-flow connector in an open position when fully mated with the chassis liquid dual-flow connector and inner and outer liquid flow paths are established.

The chassis liquid dual-flow connector 42 and module liquid dual-flow connector 50 define a quick disconnect connector arrangement as shown in the fragmentary, isometric views of FIGS. 2 and 3, showing the fully mated chassis liquid dual-flow connector and module liquid dual-flow connector. These fragmentary views show in partial shadowed lines some of the valve components inside the module liquid dual-flow connector 50. As shown in greater detail in FIGS. 9-11, the module liquid dual-flow connector 50 includes a module connector body 64 and first and second module liquid valves 66, 68 carried by the module connector body. The first and second module liquid valves 66, 68 are in a closed position when the module liquid dual-flow connector 50 is in an unmated position (FIG. 10), and are in an open position when the module liquid dual-flow connector is in a fully mated position (FIG. 11).

Figure 12:
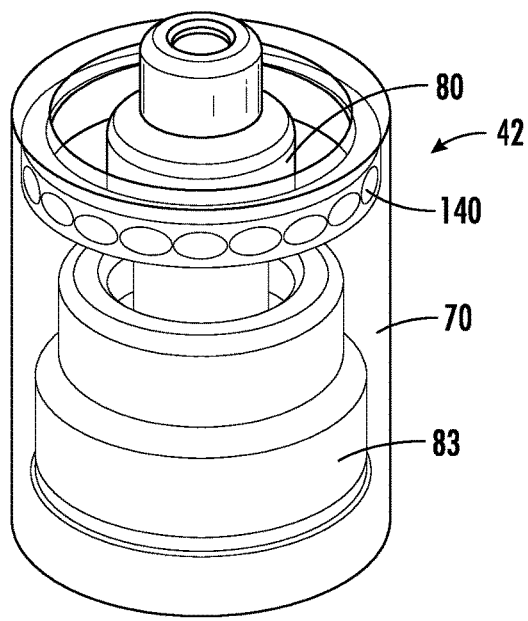
FIG. 12 is a fragmentary, isometric view of the chassis liquid dual-flow connector.
Figure 13:
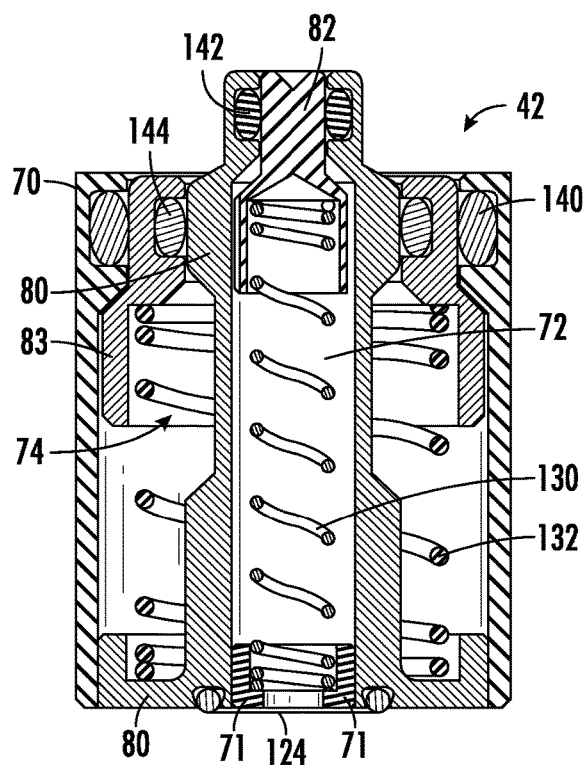
FIG. 13 is a sectional view of the chassis liquid dual-flow connector in a closed position before mating with the module liquid dual-flow connector.
Figure 14:
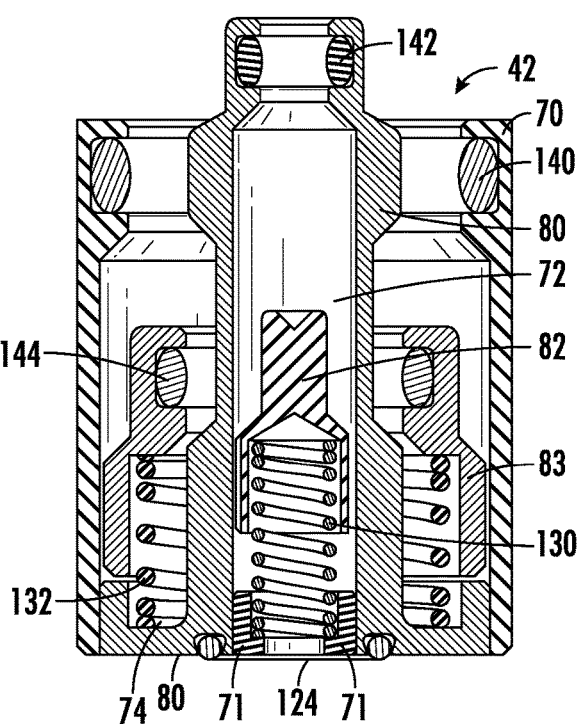
FIG. 14 is a sectional view of the chassis liquid dual-flow connector in an open position when fully mated with the module liquid dual-flow connector and inner and outer liquid flow paths are established.

As shown in FIGS. 12-14, the chassis liquid dual-flow connector 42 includes a chassis connector body 70 and first and second chassis liquid valves 72, 74 carried by the chassis connector body, which are in a closed position when the chassis liquid dual-flow connector is in an unmated position (FIG. 13), and in an open position when the chassis liquid dual-flow connector is in a fully mated position (FIG. 14).

Referring now to FIGS. 4-7, there is illustrated the sequence when the chassis liquid dual-flow connector 42 and module liquid dual-flow connector 50 are moved from a pre-engagement position (FIG. 4), into an initial engagement position (FIG. 5), then into a partially mated position (FIG. 6), and finally into a fully mated position (FIG. 7). As shown in FIG. 4, when the chassis liquid dual-flow connector 42 and module liquid dual-flow connector 50 are not engaged with each other, they are both in the closed position as also shown in FIGS. 10 and 13 for the respective module liquid dual-flow connector and chassis liquid dual-flow connector.

Upon initial engagement of the chassis liquid dual-flow connector 42 and module liquid dual-flow connector 50 shown in FIG. 5, the upper portion of a cylindrical chassis valve retainer 80 fixed in the cylindrically configured chassis connector body 70 and carrying a chassis valve plug 82 is forced against a cylindrical module valve retainer 84 and a module plug valve 86 that is carried in a cylindrical module valve bushing 88 received in the module connector body 64. The chassis valve plug 86 is forced down slightly by the enlarged end of a longitudinally extending module stem 90 configured similar to a plunger and carried by the module valve retainer 84. At this stage of mating, the first and second module liquid valves 66, 68 are closed and neither an inner liquid flow path 100 nor outer liquid flow path 104 route surrounding the inner liquid flow path are established as explained in greater detail below. The module valve bushing 88 is slightly depressed into the chassis connector body 70 as it slides over the cylindrical extension of the module valve retainer 84.

Upon further engagement of the chassis liquid dual-flow connector 42 and module liquid dual-flow connector 50 as shown in FIG. 6, the module valve plug 86 moves inward more within the module valve bushing 88 that also moves inward relative to the module connector body 64. At the same time, the plunger end of the longitudinally extending module stem 90 of the module valve retainer 84 pushes the chassis valve plug 82 downward, while the module connector body 64 presses the chassis valve bushing 83 downward so that the chassis liquid dual-flow connector 42 and module liquid dual-flow connector 50 establish an inner liquid flow path shown schematically at 100 in this partially mated position of FIG. 6. The chassis valve plug 82 includes outer surface grooves 94 that allow fluid flow at this time (FIG. 8) around the periphery of the chassis valve plug. The module valve plug 86 and chassis valve plug 82 are configured to form the respective first chassis liquid valve 72 and first module liquid valve 66.

When the chassis liquid dual-flow connector 42 and the module liquid dual-flow connector 50 are in the fully mated position as shown in FIG. 7, the inner liquid flow path 100 and outer liquid flow path 104 surrounding the inner liquid flow path are established in this fully mated position. The chassis valve plug 82 and chassis valve bushing 83 are fully depressed with the module connector body 64 depressing the chassis valve bushing 83 inward within the chassis connector body 70. Also, in this fully mated position, the module valve plug 86 and module valve bushing 88 are fully depressed with the end of the chassis valve retainer 84 configured to force both the module valve plug and module valve bushing inward.

The chassis valve bushing 83 positioned relative to the chassis valve retainer 80 in this configuration forms the second chassis liquid valve 74 and the module valve bushing 88 relative to the module connector body 64 in this configuration forms the second module liquid valve 88. The sectional view of FIG. 11 shows the module liquid dual-flow connector 50 alone and the configuration of the different valve components when in the fully mated position and first and second module liquid valves 66, 68 are in an open position. The fully closed position of the module liquid dual-flow connector 50 is shown in the sectional view of FIG. 10.

As illustrated, the module liquid dual-flow connector 50 includes its cylindrical module connector body 64 that secures at an end in a pressure fit the module valve retainer 84 and its axial, longitudinally extending module stem 90 that is coaxially fixed within the cylindrical extension of the module valve retainer. The movable module valve plug 86 is received at the end of the module connector body 64 opposite the end that mounts the module valve retainer 84 and movable upward within module valve bushing 88. The module valve bushing 88 is slidably received over the cylindrical extension of the module valve retainer 84. An inner module compression spring 110 biases the movable module valve plug 86 into its closed position (FIG. 10), and is fully seated against the inner circumferential taper of the module valve bushing 88. An outer module compression spring 112 biases the module valve bushing 88 into its fully extended position shown in FIG. 10 where it is fully seated against an inner circumferential taper of the module connector body 64.

A module connector body O-ring 114 seals between the lower interior surface of the module connector body 64 and the lower outer surface of the module valve bushing 88. A lower module valve bushing O-ring 118 seals between the inner, lower surface of the module valve bushing 88 and the outer, lower surface of the module valve plug 86. An upper module valve bushing O-ring 120 seals between the upper, inner surface of the module valve bushing 88 and the outer cylindrical extension of the module valve retainer 84. A module stem O-ring 122 seals between the interior surface of the module valve plug 86 and plug end of the module stem 90.

The outer module compression spring 112 maintains the module valve bushing 88 in its closed position, and the inner module compression spring 110 maintains the movable module valve plug 86 in its closed position as shown in FIG. 10. When fully engaged and mated with the chassis liquid dual-flow connector 42, however, the module valve bushing 88 and movable module valve plug 86 are forced inward within the module connector body 64, compressing the outer module compression spring 112 and inner module compression spring 110. This configuration establishes both the inner liquid flow path 100 and outer liquid flow path 104 that surrounds the inner liquid flow path and liquid enters and exits an orifice 100a for the inner flow path 100 and two orifices 104a for the outer liquid flow path 104 at the mounted end of the module valve retainer 80.

Figure 9:
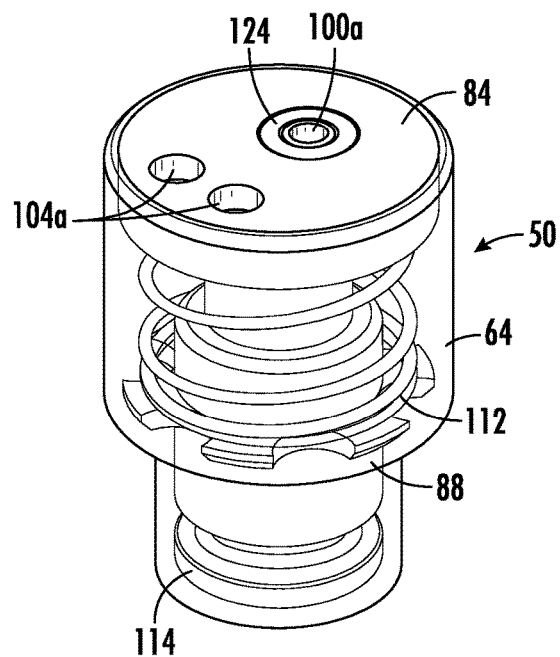
FIG. 9 is a fragmentary, isometric view of the module liquid dual-flow connector.

FIGS. 3 and 9 show that the module orifice 100a for the inner liquid flow path 100 may include a sealant O-ring 124 surrounding that module orifice 100a. The two orifices 104a for the outer flow path 104 may not require an O-ring since it may have reduced pressure flow and not subject to leakage with two different orifices for the outer flow path. When comparing the sectional view of FIG. 6 with FIG. 7, it is evident that in the partially mated position (FIG. 6), the module valve bushing 88 and module valve plug 86 are only partially compressed such that only the inner liquid flow path 100 is established and liquid flows through the one orifice 100a.

Referring now to FIGS. 12-14, there are shown details of the chassis liquid dual-flow connector 42. The chassis connector body 60 mounts in a fixed position the chassis valve retainer 80, which includes a central axial bore that establishes the inner liquid flow path 100 and includes at the end a central stop member 71 that also includes an opening for liquid flow. The chassis valve retainer 80 supports the chassis valve plug 82 that is biased outward in the central axial bore and into the closed position by the inner chassis compression spring 130, which rests on the central stop member 71. The outer chassis compression spring 132 biases the chassis valve bushing 83 into its upward closed position as shown in FIG. 13.

A chassis connector body O-ring 140 seals between the inner surface of the chassis connector body 70 and the outer surface of the chassis valve bushing 83. A chassis valve plug O-ring 142 seals between the upper, outer surface of the chassis valve plug 82 and the inner, upper cylindrical surface of the chassis valve retainer 80 when the chassis valve plug is extended (FIG. 13) or closed. A chassis valve bushing O-ring 144 seals between the upper, outer surface of the chassis valve retainer 80 and the inner surface of the chassis valve bushing 88 when in the extended position corresponding to the closed position (FIG. 13).

When fully mated as shown in the sectional view of the fully open chassis liquid dual-flow connector 42 of FIG. 14, both the outer and inner chassis compression springs 130, 132 are compressed and the chassis valve bushing 83 is forced against the lower end of the chassis valve retainer 80 and the chassis valve plug 82 is forced downward by action of the longitudinally extending module stem 90 of the module liquid dual-flow connector 50 as shown in FIG. 7. In this configuration, both the inner liquid flow path 100 and outer liquid flow path 104 surrounding the inner liquid flow path are established. Similar in configuration to the module connector body 64, the chassis connector body 70 includes an orifice 100*a* for the inner liquid flow path and two orifices 104*a* for the outer liquid flow path 104. The orifice 100*a* may include a sealant O-ring 124.

The chassis liquid dual-flow connector 42 and module liquid dual-flow connector 50 are preferably formed as male and female 3U and 6U compatible connectors defining a quick disconnect connector arrangement to facilitate liquid flow to and from the electronic module 34 using the one quick disconnect connector arrangement when mated as illustrated in FIGS. 2 and 3. Using one quick disconnect connector arrangement reduces the footprint as compared to using two spaced connectors, i.e., one for a liquid inlet and one for a liquid outlet, such as positioned at an end on opposite sides of an electronic module 34. The chassis liquid dual-flow connector 42 and module liquid dual-flow connector 50 may be formed from metallic or plastic materials and formed from machined or injection molded components.

Figure 15:
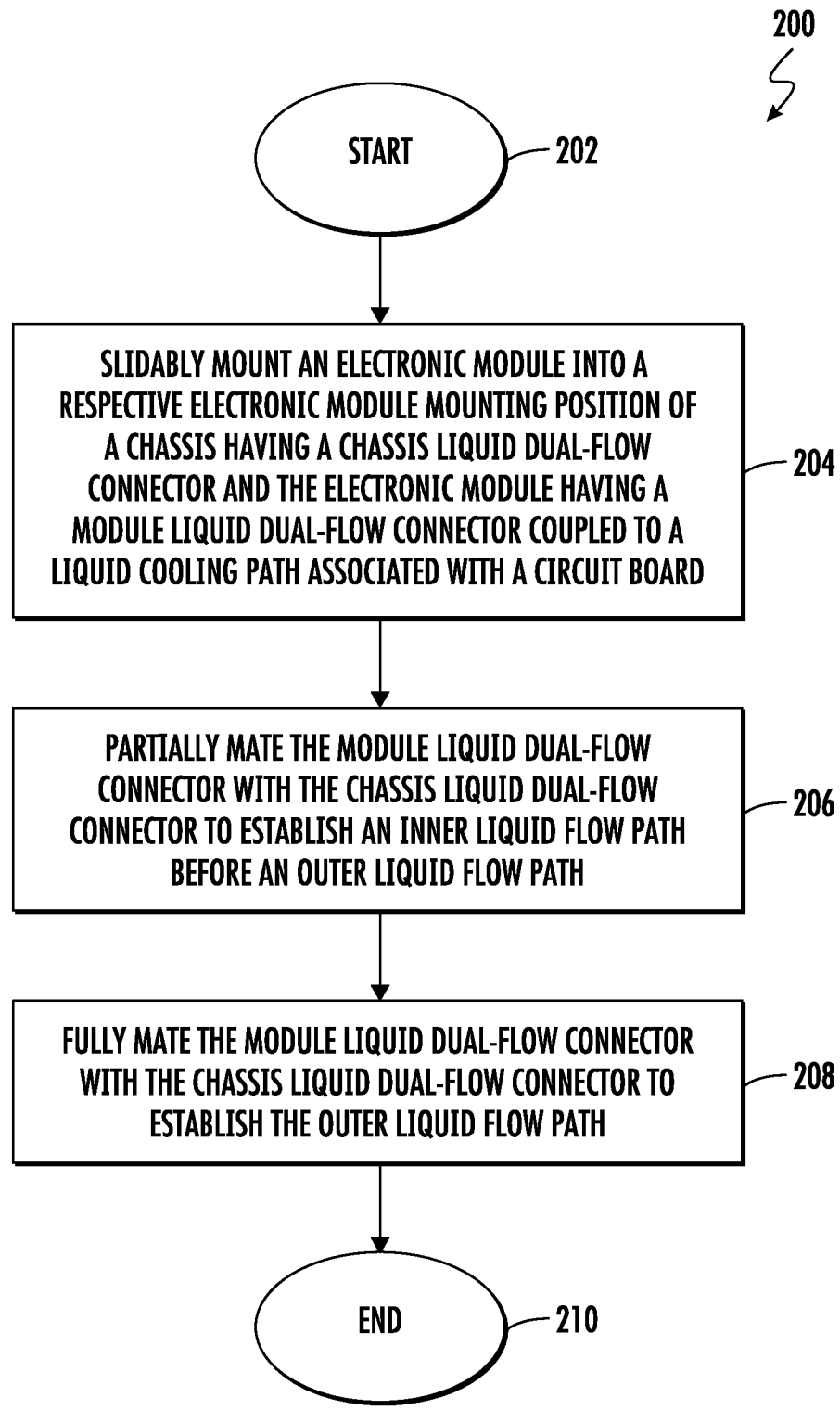
FIG. 15 is a high-level flowchart of a method of mounting an electronic module in a respective mounting position of a chassis in accordance with a non-limiting example.

Referring now to FIG. 15, there is illustrated a high-level flowchart of a method of mounting an electronic module 34 in the electronic module mounting position 26 of the chassis 24, which method is illustrated generally at 200. The process starts (Block 202) and an electronic module 34 is slidably mounted into a respective electronic module mounting position 26 of the chassis 24 having a chassis liquid dual-flow connector 42 (Block 204). The electronic module 34 has a module liquid dual-flow connector 50 coupled to a liquid cooling path 54 associated with a circuit board 56 carried by the electronic module. The module liquid dual-flow connector 50 is partially mated with the chassis liquid dual-flow connector 42 and the inner liquid flow path 100 is established before the outer liquid flow path 104. The inner liquid flow path 100 is opened first and fluid will not be able to flood the chassis and any components therein (Block 206). Upon full engagement when the chassis liquid dual-flow connector 42 and module liquid dual-flow connector 50 are fully mated, the outer liquid flow path 104 is established (Block 208). The method ends (Block 210).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. An electronic assembly comprising:
a chassis having a plurality of electronic module mounting positions, each mounting position having associated therewith a chassis liquid dual-flow connector;
a respective electronic module received in each electronic module mounting position and comprising
a circuit board,
a liquid cooling path associated with the circuit board, and
a module liquid dual-flow connector coupled to the liquid cooling path and configured to be mateable with the chassis liquid dual-flow connector so that the chassis liquid dual-flow connector and module liquid dual-flow connector establish an inner liquid flow path before an outer liquid flow path when in a partially mated position.

2. The electronic assembly of claim 1 wherein the chassis liquid dual-flow connector and module liquid dual-flow connector define a quick disconnect connector arrangement.

3. The electronic assembly of claim 1 wherein the chassis liquid dual-flow connector comprises a chassis connector body and first and second chassis liquid valves carried thereby.

4. The electronic assembly of claim 3 wherein the first and second chassis liquid valves are in a closed position when the chassis liquid dual-flow connector is in an unmated position, and are in an open position when the chassis liquid dual-flow connector is in a fully mated position.

5. The electronic assembly of claim 1 wherein the module liquid dual-flow connector comprises a module connector body and first and second module liquid valves carried thereby.

6. The electronic assembly of claim 5 wherein the first and second module liquid valves are in a closed position when the module liquid dual-flow connector is in an unmated position, and are in an open position when the module liquid dual-flow connector is in a fully mated position.

7. The electronic assembly of claim 1 wherein the chassis comprises a backplane electrical connector; and wherein the electronic module comprises an electrical connector carried by the circuit board along a back edge thereof and mateable with the backplane electrical connector.

8. The electronic assembly of claim 7 wherein the module liquid dual-flow connector is on the back edge of the circuit board adjacent the electrical connector.

9. An electronic assembly comprising:
a chassis having a plurality of electronic module mounting positions, each mounting position having associated therewith a chassis liquid dual-flow connector;
a respective electronic module received in each electronic module mounting position and comprising
a circuit board,
a liquid cooling path associated with the circuit board, and
a module liquid dual-flow connector coupled to the liquid cooling path and configured to be mateable with the chassis liquid dual-flow connector in a quick disconnect connector arrangement;
the chassis liquid dual-flow connector and the module liquid dual-flow connector establishing an inner liquid flow path and an outer liquid flow path surrounding the inner liquid flow path when in a fully mated position, the chassis liquid dual-flow connector and module liquid dual-flow connector establishing the inner liquid flow path before the outer liquid flow path when in a partially mated position.

10. The electronic assembly of claim 9 wherein the chassis liquid dual-flow connector comprises a chassis connector body and first and second chassis liquid valves carried thereby.

11. The electronic assembly of claim 10 wherein the first and second chassis liquid valves are in a closed position when the chassis liquid dual-flow connector is in an unmated position, and are in an open position when the chassis liquid dual-flow connector is in a fully mated position.

12. The electronic assembly of claim 9 wherein the module liquid dual-flow connector comprises a module connector body and first and second module liquid valves carried thereby.

13. The electronic assembly of claim 12 wherein the first and second module liquid valves are in a closed position when the module liquid dual-flow connector is in an unmated position, and are in an open position when the module liquid dual-flow connector is in a fully mated position.

14. The electronic assembly of claim 9 wherein the chassis comprises a backplane electrical connector; and wherein the electronic module comprises an electrical connector carried by the circuit board along a back edge thereof and mateable with the backplane electrical connector.

15. The electronic assembly of claim 14 wherein the module liquid dual-flow connector is on the back edge of the circuit board adjacent the electrical connector.

16. A method of mounting an electronic module in a respective mounting position of a chassis, the mounting position having associated therewith a chassis liquid dual-flow connector, the electronic module comprising a circuit board, a liquid cooling path associated with the circuit board, and a module liquid dual-flow connector coupled to the liquid cooling path, the method comprising:
  slidably mounting the electronic module in a respective mounting position of the chassis so that module liquid dual-flow connector removably mates with the chassis liquid dual-flow connector so that the chassis liquid dual-flow connector and module liquid dual-flow connector establish an inner liquid flow path before an outer liquid flow path when in a partially mated position.

17. The method of claim 16 wherein the chassis liquid dual-flow connector and the module liquid dual-flow connector define a quick disconnect connector arrangement.

18. The method of claim 16 wherein the chassis liquid dual-flow connector comprises a chassis connector body and first and second chassis liquid valves carried thereby.

19. The method of claim 18 wherein the first and second chassis liquid valves are in a closed position when the chassis liquid dual-flow connector is in an unmated position, and are in an open position when the chassis liquid dual-flow connector is in a fully mated position.

20. The method of claim 16 wherein the module liquid dual-flow connector comprises a module connector body and first and second module liquid valves carried thereby.

21. The method of claim 20 wherein the first and second module liquid valves are in a closed position when the module liquid dual-flow connector is in an unmated position, and are in an open position when the module liquid dual-flow connector is in a fully mated position.

\* \* \* \* \*